(12) United States Patent
Zhou et al.

(10) Patent No.: US 7,744,257 B2
(45) Date of Patent: Jun. 29, 2010

(54) HEAT DISSIPATION DEVICE FOR LED LAMP

(75) Inventors: Zhi-Yong Zhou, Shenzhen (CN); Guang Yu, Shenzhen (CN); Qiao-Li Ding, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 345 days.

(21) Appl. No.: 12/024,961

(22) Filed: Feb. 1, 2008

(65) Prior Publication Data
US 2009/0194254 A1    Aug. 6, 2009

(51) Int. Cl.
*F21V 29/00* (2006.01)
*F28D 15/02* (2006.01)
(52) U.S. Cl. .................................. 362/373; 165/104.33
(58) Field of Classification Search .................. 362/373; 165/104.33, 104.1
See application file for complete search history.

(56) References Cited

U.S. PATENT DOCUMENTS 6,021,044 A * 2/2000 Neville et al. .......... 165/104.33
7,547,124 B2 * 6/2009 Chang et al. ................. 362/373
2005/0263265 A1 * 12/2005 Sheng et al. ........... 165/104.21
2009/0000768 A1 * 1/2009 Zheng et al. ........... 165/104.33

FOREIGN PATENT DOCUMENTS

| CN | 2655326 Y | 11/2004 |
|----|-----------|---------|
| CN | 1705112 A | 12/2005 |
| CN | 2845166 Y | 12/2006 |

* cited by examiner

*Primary Examiner*—David V Bruce
(74) *Attorney, Agent, or Firm*—Jeffrey T. Knapp

(57) ABSTRACT

A heat dissipation device adapted for removing heat from LED modules of an LED lamp includes a plurality of heat sinks, a plurality of fin sets and a plurality of heat pipes extending through the fin sets and thermally connecting the heat sinks and the fin sets together. The heat sinks each have a base plate with a bottom surface which is kept in contact with corresponding LED modules and a plurality of fins arranged on a top surface of the base plate. Each of the fin sets consists of a plurality of flakes and defines a plurality of air passages between the flakes. Air can flow through the heat dissipation device from a place thereunder to a place thereabove via the air passages between the flakes of the fin sets.

15 Claims, 4 Drawing Sheets

HEAT DISSIPATION DEVICE FOR LED LAMP

BACKGROUND OF THE INVENTION

1. Field of the Invention

The present invention relates to a heat dissipation device, and more particularly to a heat dissipation device which is used for dissipating heat more efficiently from LED modules of an LED lamp and has a low cost.

2. Description of Related Art

As an energy-efficient light, an LED lamp has a trend of substituting the fluorescent lamp for indoor and outdoor lighting purpose; in order to increase the overall lighting brightness, a plurality of LEDs is often incorporated into a signal lamp, in which how to efficiently dissipate heat generated by the LEDs becomes a challenge.

Some of the LED lamps directly utilize heat dissipating structures that are used for cooling electronic components, e.g. CPUs, video graphic cards and hard disk drivers received in a computer. For example, a type of heat sink comprises a base plate and a plurality of fins extending upwardly from a top surface of the base plate. A bottom face of the base plate of such a heat sink is thermally connected with the electronic component. Thus, heat generated by the electronic component is conducted to the fins via the base plate, and dispersed to the surrounding environment from the fins.

Such a heat sink may be competent for the electronic component mounted in the computer, since the bottom face of the base plate is large enough for sufficiently contacting a single heat source such as the electronic component. However, when such a heat sink is used in the LED lamp which has a plurality of LEDs acting as the light source and accordingly having a plurality of heat sources (each LED functioning as an individual heat source), the base plate has to be made broad enough to cover and simultaneously contact with all of the LEDs. As a result, the heat sink should be large in size and heavy in weight and uses lot of material in manufacturing it. Additionally, the heat sink also cannot satisfy a high heat dissipating efficiency needed for the LED lamp since an airflow cannot flow through the base plate to take the heat dissipated from the fins to the ambient air.

What is needed, therefore, is a heat dissipation device for an LED lamp which can overcome the above-mentioned disadvantages.

SUMMARY OF THE INVENTION

A heat dissipation device adapted for removing heat from LED modules of an LED lamp includes a plurality of heat sinks, a plurality of fin sets and a plurality of heat pipes extending through the fin sets and thermally connecting the heat sinks and the fin sets together. The heat sink has a base plate with a bottom surface which is kept in contact with the LED modules and a plurality of fins arranged on a top face of the base plate. Each of the fin sets consists of a plurality of flakes and defines a plurality of air passages between the flakes. Each fin set is located between two neighboring heat sinks. Heat generated by the LED modules is first absorbed by the heat sinks and then transferred to the fin sets via the hat pipes. Cooling air can flow from a place below a bottom to reach a place above a top of the heat dissipation device via the air passages of the fin sets.

Other advantages and novel features of the present invention will become more apparent from the following detailed description when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION OF THE INVENTION

Referring to FIGS. 1 to 4, a heat dissipation device in accordance with a preferred embodiment of the present invention is used for removing heat from LED modules 40 used in an LED lamp. The heat dissipation device includes three heat sinks 10 in contact with the LED modules 40, two groups of fin sets 20 sandwiched between every two adjacent heat sinks 10 and a plurality of heat pipes 30 thermally connecting the three heat sinks 10 and the two groups of fin sets 20 together. The three heat sinks 10 and the two groups of fins sets 20 are arranged in an alternated manner.

Figure 1:
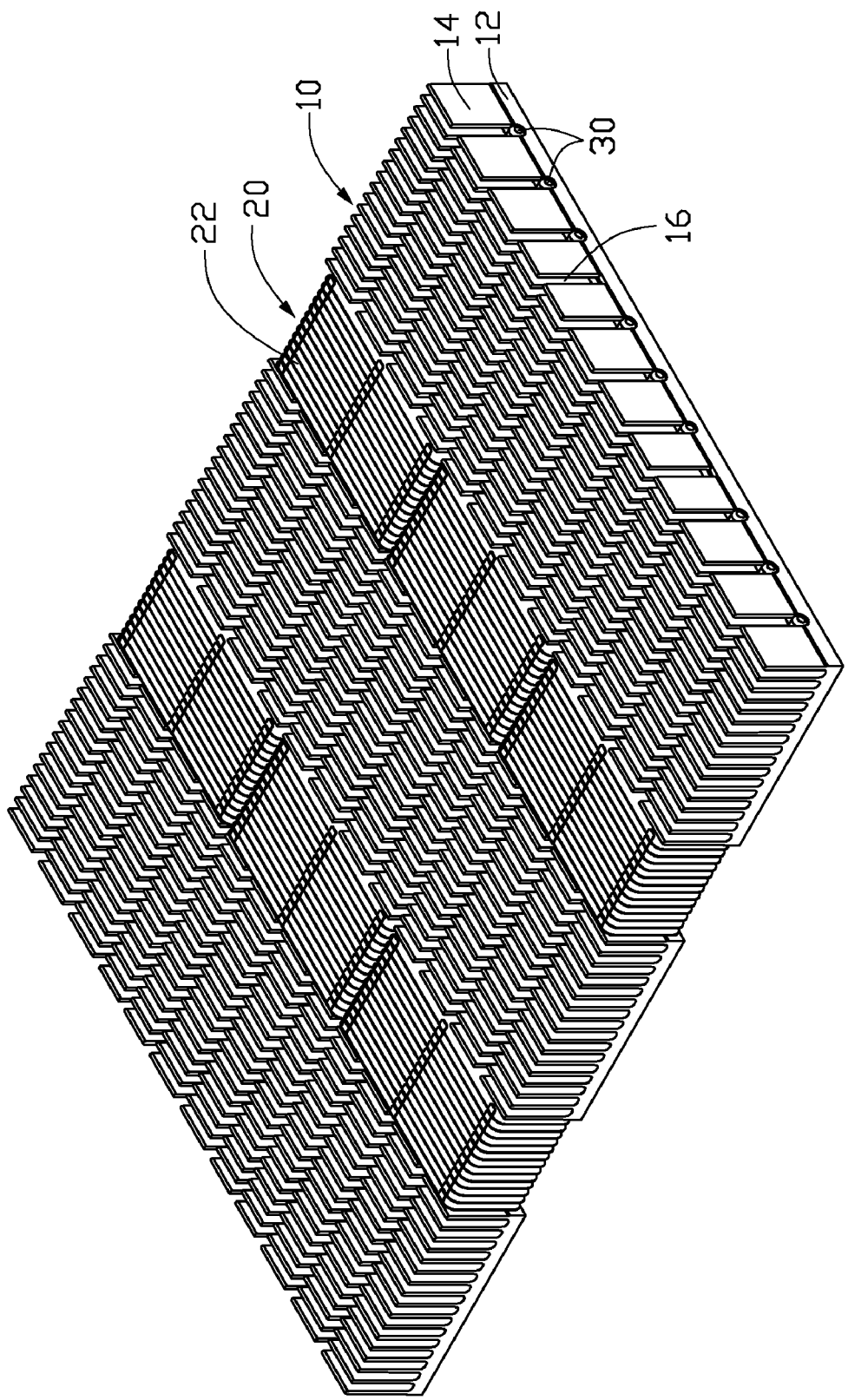
FIG. 1 is an assembled, isometric view of a heat dissipation device for an LED lamp in accordance with a preferred embodiment of the present invention.
Figure 2:
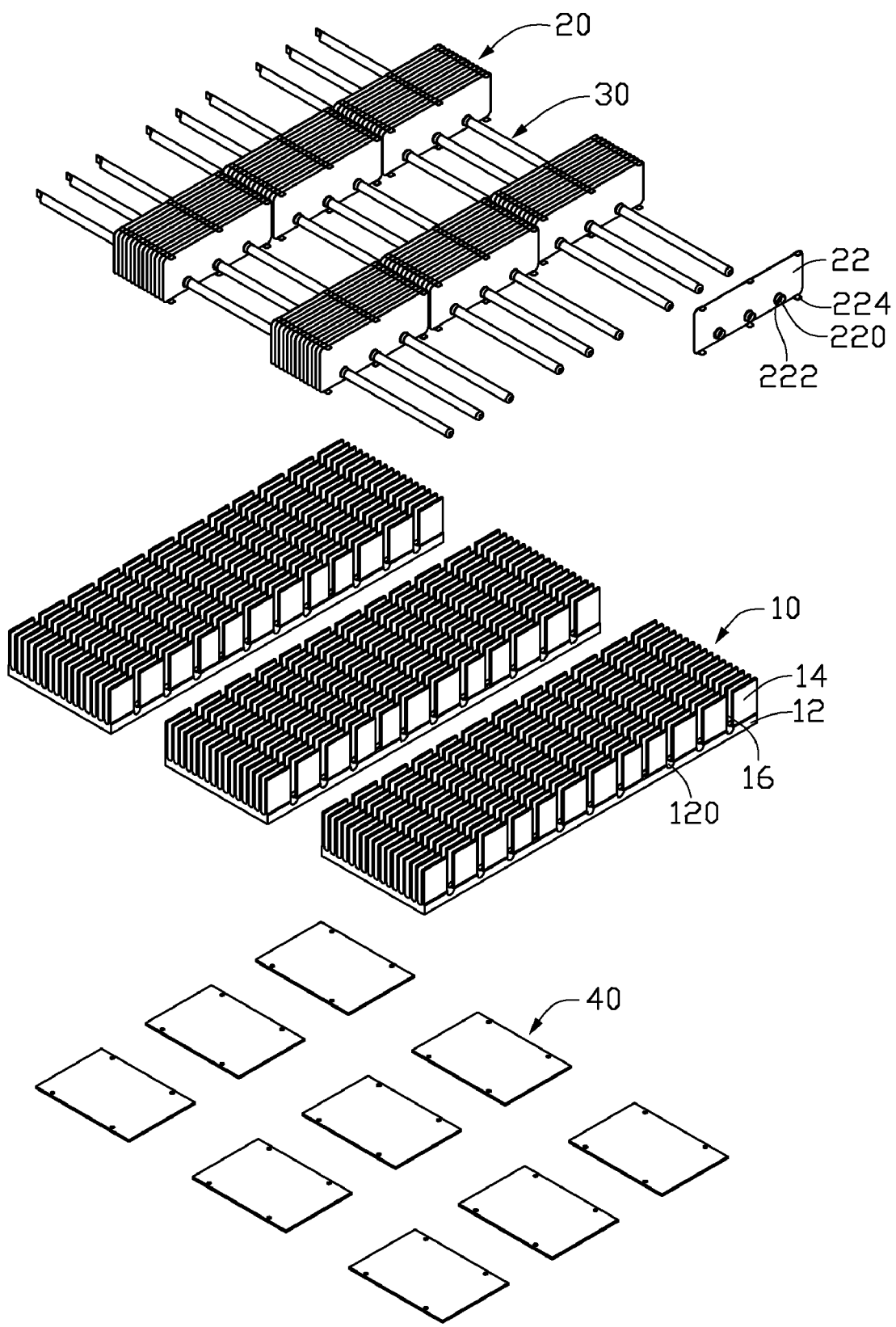
FIG. 2 is an exploded view of FIG. 1.

Particularly referring to FIGS. 1 and 2, each of the heat sinks 10 is made of material with a good heat conductivity such as aluminum and copper, and comprises a rectangular base plate 12 and a plurality of parallel fins 14 extending perpendicularly from a top surface of the base plate 12. The fins 14 are spaced from each other with a predetermined distance and parallel to two opposite long sides of the base plate 12. Every two neighboring fins 14 form an air passage therebetween for allowing airflow to flow through. An extending direction of the air passage of the fins 14 is parallel to the long sides of the base plate 12. The heat sink 10 defines a plurality receiving channels 16 therein. The receiving channels 16 which are spaced from each other with a certain distance are perpendicular to the fins 14 and extend through the fins 14 transversely. An extending direction of the receiving channels 16 is parallel to opposite short sides of the base plate 12. The base plate 12 defines a semicircular recession 120 in the top surface thereof, corresponding to a bottom of each receiving channel 16 for maximizing a contacting area between the base plate 12 and a corresponding heat pipe 30 received in the recession 120.

Each group of fin sets 20 includes three fin sets 20. Each of the fin sets 20 consists of a plurality of rectangular flakes 22 made of highly heat conductive material such as copper, aluminum etc. Every two neighboring flakes 22 form an air passage therebetween for allowing airflow to flow therethrough, and each of the flakes 22 defines three through holes 220 therein. The air passages of the flakes 22 are parallel to the air passages of the fins 14. In order to increase a contacting area between the flakes 22 and the heat pipes 30, an annular flange 222 protrudes from an edge of each of the through holes 220. The flakes 22 defining the through holes 220 incorporate with the corresponding flanges 222 to form tubes (not labeled) for receiving the corresponding heat pipes 30 therein. The three through holes 220 are located adjacent to a bottom edge of the flake 22 and spaced from each other with a distance consistent with that between two neighboring receiving channels 16 of the heat sink 10, so that the tubes can respectively communicate and align with the receiving channels 16 of the heat sink 10 when the fin sets 20 are sandwiched between two of the heat sinks 10. Each of the flakes 22 has three spaced tabs 224 extending perpendicularly from an upper and a lower edge thereof toward a lateral side thereof. The tables 224 are used for keeping the flakes 22 spaced from each other to allow airflow flow therethrough from a space below the fin sets 20 to a place above the fin sets 20 of the heat dissipation device.

The heat pipes 30 each are elongated and circular in cross section. The heat pipes 30 are made to be perfectly embedded in the semicircular recessions 120 of the base plate 12 of the heat sink 10 and received in the tubes formed by the flakes 22 defining the through holes 220 and the corresponding flanges 222 of the flakes 22.

Figure 3:
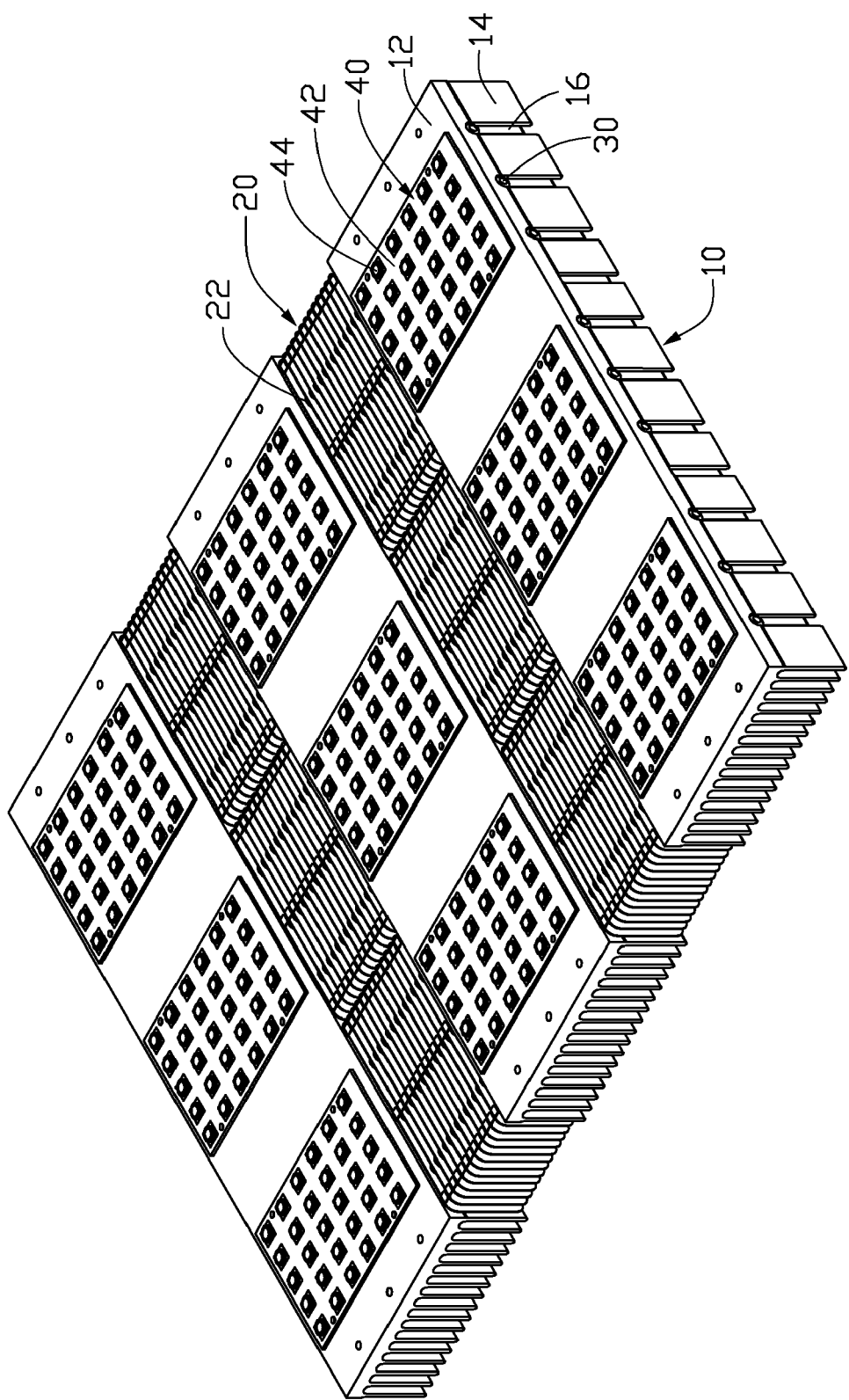
FIG. 3 is a view similar to FIG. 1, but viewed from an inverted aspect.

Particularly referring to FIG. 3, the LED modules 40 are evenly attached to a bottom surface of each of the base plates 12 in a heat conductive relationship. Every heat sink 10 has three LED modules 40 mounted thereon corresponding to the fin sets 20. Each of the LED modules 40 comprises a rectangular printed circuit board 42 and a plurality of LEDs 44 evenly mounted on the printed circuit board 42 in a predetermined arrangement.

Figure 4:
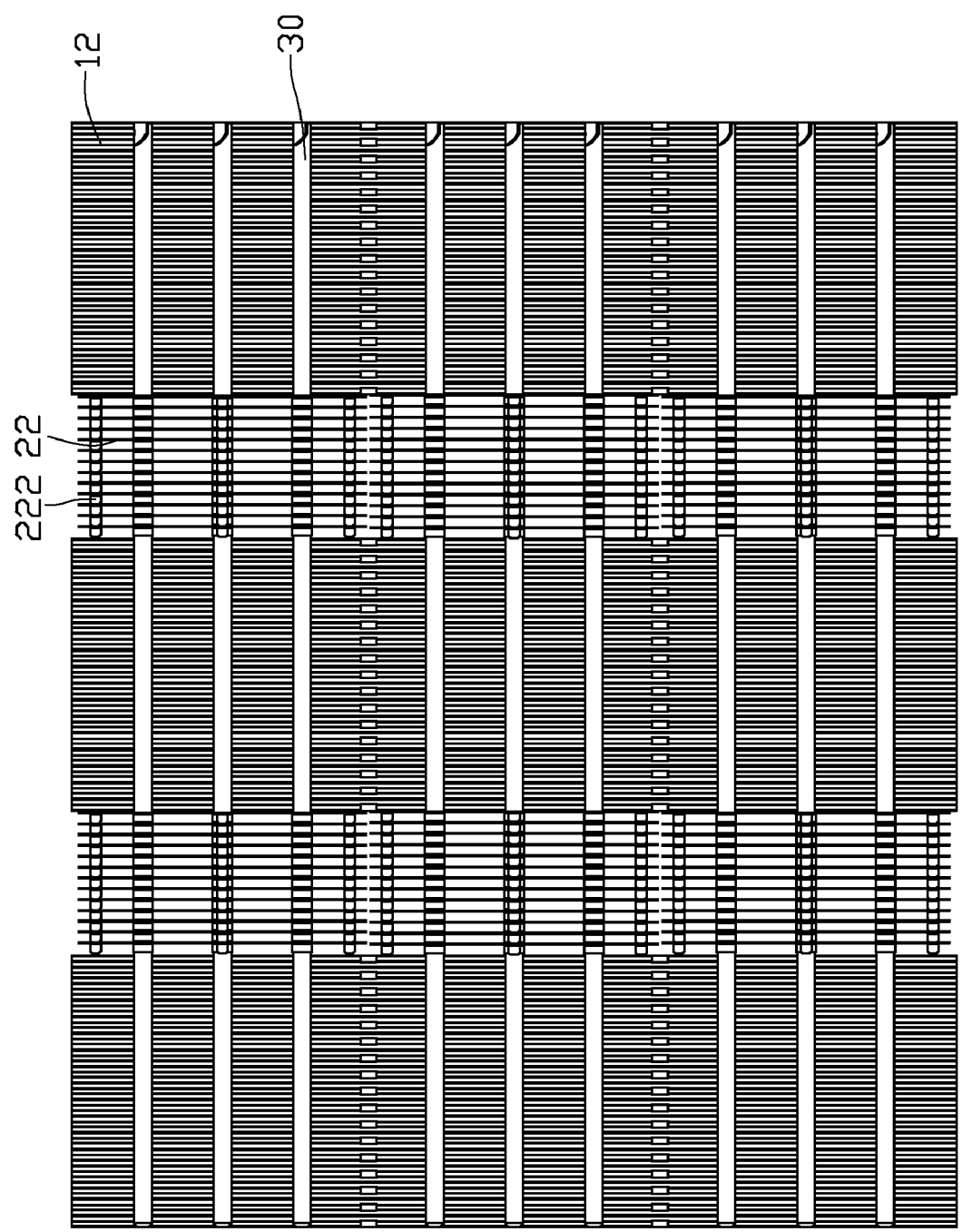
FIG. 4 is a top view of FIG. 1.

Also referring to FIG. 4, in assembly of the heat dissipation device, the heat pipes 30 extend through the two spaced groups of fin sets 20 in sequence. Portions of the heat pipes 30 exposed out of the two groups of the fin sets 20 are put into the corresponding recessions 120 of the base plates 12 of the heat sinks 10 through the corresponding receiving channels 16 of the heat sinks 10 and can be secured in the bottoms of the receiving channels 16 by soldering or adhering. The LED modules 40 can be thermally attached to the bottom surface of the heat sinks 10 by screws (not shown) which extend through the printed circuit boards 42 and threadedly engage in the bottom surfaces of the base plates 12. In order to enhance a heat exchange between the LED modules 40 and the heat sinks 10, thermal conductive grease is filled between the LED modules 40 and the bottom surfaces of the base plates 12 of the heat sinks 10.

In use of the heat dissipation device, heat generated by the LED modules 40 is absorbed by the base plates 12 of the heat sinks 10, then transferred to the fins 14 directly and delivered to the fin sets 20 via the heat pipes 30, and finally dissipated into ambient air mainly by the fins 14 of the heat sinks 10 and the fin sets 20. Furthermore, when air between the flakes 22 of the fin sets 20 is heated, it flows upwardly to form an airflow which flows from a place beneath the heat dissipation device to a place above the heat dissipation device; thus, air circulation surrounding the heat dissipation device is greatly promoted and heat dissipating efficiency of the heat dissipation device is also dramatically improved. As the flakes 22 of the fin sets 20 are simple and economical in manufacturing, cost of the heat dissipation device is decreased, but heat dissipating area of the heat dissipation device can be enlarged significantly, meanwhile a weight of the heat dissipation device is reduced. Therefore, the LED lamp incorporating the heat dissipation device in accordance with the present invention can be more reliably mounted on a stand (not shown) of the LED lamp.

It is easy to be understood, quantities of the heat sinks 10 and the corresponding fin sets 20 are not restricted to the disclosed number. If the heat pipes 30 are extended a required distance, there can be two more groups of fin sets 20 attached the heat dissipation device at locations beside the outer heat sinks, respectively, to further increase the heat dissipation capability of the heat dissipation device.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device adapted for removing heat from LED modules of an LED lamp comprising:
    a plurality of heat sinks each having a base plate with a bottom surface for contacting with corresponding LED modules and a plurality of fins arranged on the base plate;
    a plurality of fin sets arranged alternately with the heat sinks, each of the fin sets consisting of a plurality of flakes and defining a plurality of air passages between the flakes; and
    a plurality of heat pipes extending through the fin sets and thermally connecting the base plates of the heat sinks and the fin sets together.

2. The heat dissipation device as claimed in claim 1, wherein heat pipes are embedded in the base plates of the heat sinks.

3. The heat dissipation device as claimed in claim 1, wherein each of the flakes defines a plurality of through holes therein and flanges extending perpendicular from edges of the through holes, and the flakes defining the through holes incorporate with corresponding flanges to form tubes receiving the heat pipes therein.

4. The heat dissipation device as claimed in claim 3, wherein each of the flakes has a plurality of spaced tabs extending perpendicularly from upper and lower edges thereof and toward a lateral side thereof.

5. The heat dissipation device as claimed in claim 3, wherein the through holes are spaced from each other with a predetermined distance and located adjacent to a bottom edge of the each flake.

6. The heat dissipation device as claimed in claim 5, wherein the fins are parallel to two opposite long sides of each of the base plates and the flakes.

7. The heat dissipation device as claimed in claim 6, wherein the heat sinks each define a plurality of receiving channels perpendicularly to fins and parallel to two opposite short sides of the base plate thereof, and the base plate at a bottom of each of the receiving channels defines a recession which is communicated and aligned with a corresponding tube of a corresponding fin set and receiving a corresponding heat pipe therein.

8. An LED lamp comprising:
    a plurality of heat sinks, each of the heat sinks comprising a base plate and a plurality of fins arranged on the base plate;
    a plurality of fin sets each comprising a plurality of flakes and defining a plurality of air passages between the flakes;
    a plurality of LED modules attached a bottom of the base plate of each of the heat sinks; and
    a plurality of heat pipes extending through the fin sets and the base plates of the heat sinks and thermally connecting the fin sets and the base plates together, wherein the fin sets and the heat sinks are alternate with each other.

9. The LED lamp as claimed in claim 8, wherein each LED module comprises a printed circuit board attached to the bottom of the base plate and a plurality of LEDs mounted on the printed circuit board.

10. The LED lamp as claimed in claim 8, wherein the heat pipes are embedded in the base plates of the heat sinks.

11. The LED lamp as claimed in claim 8, wherein each of the flakes defines a plurality of through holes therein and flanges extending perpendicular from edges of the through holes, the flakes defining the through holes incorporate with corresponding flanges to form tubes receiving the heat pipes therein.

12. The LED lamp as claimed in claim 8, wherein the fins are parallel to two opposite long sides of each of the base plates and the flakes.

13. The LED lamp as claimed in claim 12, wherein the heat sinks each defines a plurality of receiving channels perpendicular to the fins, and the base plate at a bottom of each of the receiving channels defines a recession which is communicated and aligned with a corresponding tube of a corresponding fin set and receiving a corresponding heat pipe therein.

14. An LED lamp comprising:
two heat sinks each comprising a base plate with a bottom surface and a top surface, and a plurality of fins extending upwardly from the top surface of the base plate of the each heat sink;
a fin set located between the heat sinks and comprising a plurality of flakes defining a plurality of passages therebetween;
a heat pipe extending through the flakes and thermally connecting the fin set and the heat sinks together, wherein air can flow from a place under the fin set to a place above the fin set via the passages; and
a plurality of LED modules attached to the bottom surface of the base plate of the each heat sink, each LED module having a printed circuit board and a plurality of LEDs mounted on the printed circuit board.

15. The LED lamp as claimed in claim 14, wherein the base plate defines a recession in the top surface thereof, and the heat pipe has a portion embedded in the recession.

* * * * *